United States Patent
Heule et al.

(10) Patent No.: US 9,625,547 B2
(45) Date of Patent: Apr. 18, 2017

(54) MAGNETIC RESONANCE IMAGING METHOD FOR THE QUANTIFICATION OF THE $T_1$ AND/OR $T_2$ RELAXATION TIMES IN A SAMPLE

(71) Applicant: UNIVERSITATSSPITAL BASEL, Basel (CH)

(72) Inventors: Rahel Heule, Basel (CH); Oliver Bieri, Liestal (CH)

(73) Assignee: UNIVERSITATSSPITAL BASEL, Basel (CH)

( * ) Notice: Subject to any disclaimer, the term of this patent is extended or adjusted under 35 U.S.C. 154(b) by 992 days.

(21) Appl. No.: 13/852,239

(22) Filed: Mar. 28, 2013

(65) Prior Publication Data

US 2014/0292325 A1    Oct. 2, 2014

(51) Int. Cl.
    *G01V 3/00*    (2006.01)
    *G01R 33/44*    (2006.01)
    *G01R 33/561*    (2006.01)

(52) U.S. Cl.
    CPC ........ *G01R 33/448* (2013.01); *G01R 33/5613* (2013.01)

(58) Field of Classification Search
    CPC .................................................. G01R 33/5613
    USPC ................. 324/309, 307, 306, 314
    See application file for complete search history.

(56) References Cited

U.S. PATENT DOCUMENTS

| | | | |
|---|---|---|---|
| 8,947,086 B2 * | 2/2015 | Rehwald ............ | G01R 33/5614 324/306 |
| 9,008,753 B2 * | 4/2015 | Messroghli ........ | G01R 33/4818 324/309 |
| 9,176,212 B2 * | 11/2015 | Edelman ............ | G01R 33/5635 |
| 2005/0110489 A1 * | 5/2005 | Miyoshi ................ | G01R 33/54 324/309 |

OTHER PUBLICATIONS

Bernstein MA, King KF, Zhou XJ. Handbook of MRI Pulse Sequences: Elsevier Academic Press; 2004.
Deoni SC, Rutt BK, Peters TM. Rapid combined $T_1$ and $T_2$ mapping using gradient recalled aquisition in the steady state. Magn Reson Med 2003; 49(3): 515-526.

(Continued)

*Primary Examiner* — Louis Arana
(74) *Attorney, Agent, or Firm* — Sughrue Mion, PLLC

(57) ABSTRACT

A magnetic resonance imaging (MRI) method for the quantification of the longitudinal ($T_1$) and/or transverse ($T_2$) relaxation times in a sample. According to the MRI method, a sample is subjected to an unbalanced steady state free precession (SSFP) sequence comprising a series of consecutive radiofrequency (RF) pulses. By means of the unbalanced SSFP sequence, a first order SSFP FID signal ($F_1$), a lowest order SSFP FID signal ($F_0$), and a lowest order SSFP Echo signal ($F_{-1}$) are acquired. Based on the $F_0$-signal, the $F_1$-signal and the $F_{-1}$-signal, the longitudinal ($T_1$) and/or transverse ($T_2$) relaxation times of the sample are determined.

19 Claims, 9 Drawing Sheets

(56) References Cited

OTHER PUBLICATIONS

Schmitt P., Griswold MA, Jakob PM, Kotas M, Gulani V., Flentje M., Haase A. Inversion recovery TrueFISP: quantification of $T_1$, $T_2$, and spin density. Magn Reson Med 2004; 51(4): 661-667.

Yarnykh VL. Optimal radiofrequency and gradient spoiling for improved accuracy of $T_1$ and $B_1$ measurements using fast steady-state techniques. Magn Reson Med 2010; 63(6): 1610-1626.

Deoni SC, Peters TM, Rutt BK. High-resolution $T_1$ and $T_2$ mapping of the brain in a clinically acceptable time with DESPOT1 and DESPOT2. Magn Reson Med. 2005; 53(1): 237-241.

Bieri O., Scheffler K., Welsch GH, Trattnig S., Mamishch TC, Ganter C. Quantitative mapping of $T_2$ using partial spoiling. Magn Reson Med 2011;66(2): 410-418.

Welsch GH, Scheffler K., Mamisch TC, Hughes T., Millington S., Deimling M., Trattnig S. Rapid estimation of cartilage $T_2$ based on double echo at steady state (DESS) with 3 Tesla. Magn Reson Med 2009; 62(2): 544-549.

Vlaardingerbroek MT, den Boer JA. Magnetic Resonance Imaging. 3rd ed. Berlin: Springer-Verlag; 2003. pp. 423-467.

Bieri O., Ganter C., Scheffler K. On the fluid-tissue contrast behavior of high-resolution steady-state sequences. Magn Reson Med 2012; 68(5): 1586-1592.

\* cited by examiner

MAGNETIC RESONANCE IMAGING METHOD FOR THE QUANTIFICATION OF THE $T_1$ AND/OR $T_2$ RELAXATION TIMES IN A SAMPLE

TECHNICAL FIELD

The present invention concerns a magnetic resonance imaging (MRI) method for the quantification of the longitudinal ($T_1$) and/or transverse ($T_2$) relaxation times in a sample. The present invention also concerns a computer program comprising executable instructions for carrying out such a MRI method as well as a MRI system configured for carrying out such a MRI method.

PRIOR ART

Magnetic resonance imaging (MRI) is a well-known medical imaging technique that allows visualizing internal structures of the human (and the animal) body in great detail. While morphology assessment by means of MRI has proven to be a diagnostic tool of great value in a wide area of diseases and applications, the early detection of subtle or diffuse pathological changes still represents a challenging, if not impossible task, even for a well-trained and experienced radiologist. Likewise problematic are the examination of a certain treatment or of drug effects over a certain time period as well as clinical trials in drug research across different sites, due to the difficulties to guarantee an unbiased and objective assessment of MRI morphology images.

Therefore, an important future step towards a significant improvement of the diagnostic potential of MRI is the application of imaging techniques allowing a quantitative rather than a qualitative assessment of specific properties of the human body with high specificity and sensitivity. Thereby, particularly the longitudinal and transversal relaxation times, usually referred to as $T_1$ and $T_2$ values, respectively, are of great interest.

Relaxation is one of the most fundamental fingerprints of NMR: It not only defines contrast in conventional MRI, but also reflects the local interaction of water on a molecular and thus very fundamental level. Longitudinal relaxation ($T_1$) is typically assessed from inversion recovery (IR) spin echo (SE) techniques, whereas transverse relaxation ($T_2$) is commonly based on sampling the decay of the transverse magnetization using single-echo or multi-echo SE methods. Acquiring the complete $T_1$ recovery or $T_2$ decay curve is time-consuming and frequently requires segmented imaging strategies. The overall success and applicability of quantitative MRI methods in the clinical setting, however, will depend greatly on the overall acquisition speed.

A particularly fast MRI technique that is widely used for the assessment of morphology is steady state free precession (SSFP). SSFP imaging techniques, of which a large number have been described so far (e.g., see Bernstein M A, King K F, Zhou X J. Handbook of MRI Pulse Sequences: Elsevier Academic Press; 2004), are generally based on a gradient-echo MRI sequence having a repetition time TR between consecutive radiofrequency pulses that is typically much shorter than the transversal relaxation time $T_2$ of the sample. Besides morphological imaging, SSFP has also attracted considerable interest for fast quantitative MRI, especially for fast relaxation time mapping (Deoni S C, Rutt B K, Peters T M. Rapid combined $T_1$ and $T_2$ mapping using gradient recalled acquisition in the steady state. Magn Reson Med 2003; 49(3):515-526 and Schmitt P, Griswold M A, Jakob P M, Kotas M, Gulani V, Flentje M, Haase A. Inversion recovery TrueFISP: quantification of $T_1$, $T_2$, and spin density. Magn Reson Med 2004; 51(4):661-667).

A common feature of rapid SSFP sequences is their mixed $T_2/T_1$ imaging contrast, which is a natural consequence of the short pulse repetition time (TR). As a result, accurate quantification of relaxation times using SSFP-based imaging techniques is hampered by a varying marginal $T_2$-related bias in $T_1$ estimates, as seen in RF spoiled SSFP (Yarnykh V L. Optimal radiofrequency and gradient spoiling for improved accuracy of $T_1$ and $B_1$ measurements using fast steady-state techniques. Magn Reson Med 2010; 63(6): 1610-1626), or by a more or less pronounced $T_1$-related bias in $T_2$, as seen in balanced SSFP (Deoni S C, Peters T M, Rutt B K. High-resolution $T_1$ and $T_2$ mapping of the brain in a clinically acceptable time with DESPOT1 and DESPOT2. Magn Reson Med 2005; 53(1):237-241), partially spoiled SSFP (Bieri O, Scheffler K, Welsch G H, Trattnig S, Mamisch T C, Ganter C. Quantitative mapping of $T_2$ using partial spoiling. Magn Reson Med 2011; 66(2):410-418), and double echo SSFP (Welsch G H, Scheffler K, Mamisch T C, Hughes T, Millington S, Deimling M, Trattnig S. Rapid estimation of cartilage $T_2$ based on double echo at steady state (DESS) with 3 Tesla. Magn Reson Med 2009; 62(2): 544-549). Moreover, all SSFP imaging techniques proposed so far, as well as multi-echo SE techniques commonly used for $T_2$ mapping, are highly sensitive to transmit field ($B_1$) inhomogeneities that become especially prominent at high (3 T) to ultra-high (7 T and higher) field strengths. As a result, without additional corrective data, accurate and thus fast and reliable quantification of relaxation times is not feasible in practice.

In summary, several different steady state methods have been proposed for relaxometry, but none are perfect: all of them are $B_1$-sensitive, require multiple scans (except for the double echo SSFP approach (DESS)), suffer from a $T_2/T_1$ related bias, or are prone to inhomogeneities in the main magnetic ($B_0$) field.

SUMMARY OF THE INVENTION

It is an object of the present invention to provide a magnetic resonance imaging (MRI) method, which allows a fast and accurate quantification of the longitudinal ($T_1$) and/or transverse ($T_2$) relaxation times in a sample.

The present invention provides a magnetic resonance imaging (MRI) method for the quantification of the longitudinal ($T_1$) and/or transverse ($T_2$) relaxation times in a sample, comprising at least the following steps:
  subjecting a sample to an unbalanced steady state free precession (SSFP) sequence comprising a series of consecutive radiofrequency (RF) pulses;
  acquiring a first order SSFP FID signal ($F_1$);
  acquiring a lowest order SSFP FID signal ($F_0$);
  acquiring a lowest order SSFP Echo signal ($F_{-1}$); and
  determining the longitudinal ($T_1$) and/or transverse ($T_2$) relaxation times of the sample based on the $F_0$-signal, the $F_1$-signal and the $F_{-1}$-signal.

With unbalanced SSFP, crusher gradients are applied to dephase the remaining transverse magnetization (usually by an angle of $2\pi$) prior to each RF pulse. This, in general, leads to a complex evolution in the phase history of the magnetization that can be traced using a representation that is closely related to configuration theory, e.g. cf. Vlaardingerbroek M T, den Boer J A. Magnetic Resonance Imaging. 3rd ed. Berlin: Springer-Verlag; 2003. pp 423-467. To this end, the evolution of the magnetization is written as a series of multiply dephased states or modes (given in crusher gradient units). The SSFP signal from the free induction decay (FID) corresponds hereby to the lowest order mode $F_0$, being zero-fold dephased. Similar, the SSFP FID signal from the $F_1$ state relates to a first order configuration in the magnetization that is one-fold dephased (measured in units of the crusher gradient). In contrast, negative mode orders indicate that after a correspondent amount of crusher gradients an Echo will be formed, as for the lowest order SSFP Echo signal from the $F_{-1}$ state, that is after one-fold application of the crusher gradients.

Preferably, the lowest order SSFP FID signal ($F_0$), the first order SSFP FID signal ($F_1$) and the lowest order SSFP Echo signal ($F_{-1}$) are acquired timely separated, but between each of two consecutive RF pulses. With a particularly preferred MRI sequence, between each of two consecutive RF pulses the $F_1$-signal, the $F_0$-signal and the $F_{-1}$-signal are acquired, and advantageously the signals are acquired in such a chronological order that first the $F_1$-signal is acquired, then the $F_0$-signal and finally the $F_{-1}$-signal. Alternatively, but less preferred, it would of course also be possible to acquire the $F_1$-signal, the $F_0$-signal and the $F_{-1}$-signal in a different chronological order. The $F_1$-signal, the $F_0$-signal and the $F_{-1}$-signal also do not necessarily have to be acquired together between two consecutive RF pulses, but might be acquired separately, as to reduce susceptibility related issues.

It is the basic idea of the current invention to make use of the different functional dependencies of the two lowest order SSFP FID modes ($F_0$ and $F_1$) and of the lowest order SSFP Echo mode ($F_{-1}$), in order to determine $T_1$ and/or $T_2$ relaxation times of the sample. Generally, the ideal SSFP signal (no motion, no diffusion, quasi-instantaneous RF pulses) can be written in a representation that is closely related to configuration theory. Expressions for the two lowest order modes ($F_0$ representing the lowest order FID, and $F_{-1}$ representing the lowest order Echo) immediately following the excitation pulse of flip angle α can be found e.g. in, Hanicke W, Vogel H U. An analytical solution for the SSFP signal in MRI. Magn Reson Med 2003; 49(4):771-775.

$$F_0 \propto 1-(E_1-\cos\alpha)\cdot r$$

$$F_{-1} \propto (1-(1-E_1\cos\alpha)\cdot r)E_2^{-1}$$

with definitions $$E_{1,2}:=\exp(-TR/T_{1,2})$$

$$p:=1-E_1\cos\alpha-E_2^2(E_1-\cos\alpha)$$

$$q:=E_2(1-E_1)(1+\cos\alpha)$$

$$r:=(1-E_2^2)(p^2-q^2)^{-1/2}$$

All higher order modes $F_n$ can then be derived from $F_0$ and $F_{-1}$ as $$F_n = \begin{cases} \left(\frac{u_1}{u_0}\right)^n \cdot F_0 & \text{for } n \geq 0 \\ \left(\frac{u_1}{u_0}\right)^{|n|-1} \cdot F_{-1} & \text{for } n < 0 \end{cases}$$

using $u_0 := p(p^2-q^2)^{-1/2}$, $u_1 := \frac{p}{q}(u_0-1)$

For the $F_1$ mode, it can thus be found $$F_1 \propto q^{-1}\cdot(p-\sqrt{p^2-q^2})\cdot(1-(E_1-\cos\alpha)\cdot r)$$

Taking now into account that the signals are acquired at a certain time t>0 (rather than t=0) after each respective RF pulse, the signals become weighted by their corresponding echo time ($TE_1$, $TE_0$, and $TE_{-1}$; see FIG. 5):

$$F_{1,0,-1} \rightarrow F_{1,0,-1} \times \exp(-TE_{1,0,-1}/T_2)$$

For short enough echo times the equations above are dependent on $T_2$ rather than on $T_2^*$, wherein $T_2^*$ relates to the transversal relaxation time being not only influenced by spin-spin interactions such as $T_2$, but also by magnetic field inhomogeneities and susceptibility effects (thus, $T_2^*<T_2$, and usually $T_2^*<<T_2$). It has been found that particularly accurate results with regard to $T_2$ are achieved, if the unbalanced SSFP sequence is configured such, that the repetition time interval TR is preferably shorter than 50 ms, more preferably shorter than 30 ms and most preferably shorter than 20 ms. The echo time $TE_1$ of the first order SSFP FID signal ($F_1$) is preferably less than 15 ms, more preferably less than 10 ms, and most preferably even less than 5 ms. Accordingly, the echo time $TE_0$ of the lowest order SSFP FID signal ($F_0$) is preferably less than 15 ms, more preferably less than 10 ms, and the echo time $TE_{-1}$ of the lowest order SSFP Echo signal ($F_{-1}$) is preferably less than 20 ms, more preferably less than 15 ms.

Thus, by acquiring the $F_1$-, the $F_0$- and the $F_{-1}$-signals by means of an unbalanced SSFP sequence, rapid MRI quantification of the $T_1$ and/or $T_2$ relaxation times is possible. Surprisingly, the determination of $T_2$ relaxation times using this method is not affected by errors in the transmit field ($B_1$) generated by the RF coil when exciting the magnetization of the sample, which errors become especially prominent in many customary MRI sequences at high (3 T) to ultra-high (7 T and higher) field strength. Therefore, an especially accurate measurement of $T_2$ values is possible with the method described even at high and ultra-high field strengths. Accurate $T_2$-quantification is also possible in combination with spectral-spatial excitation pulses that typically entail flip angle calibration errors in the presence of $B_0$ heterogeneities. In order to obtain accurate $T_1$ values over the entire field-of-view (FOV), corrective data, which reflect the $B_1$ field errors, are preferably acquired additionally.

Due to the acquisition of three different signals in steady state, the MRI-method indicated above is also termed triple echo steady state (TESS) relaxometry in the following. Preferably, the entire MRI data acquisition for determining the $T_1$ and/or $T_2$ values is performed in only one scan.

Preferably, two-dimensional (2D) or even three-dimensional (3D) data is acquired by means of the unbalanced SSFP sequence. Thus, preferably a first image data set is acquired based on the $F_1$-signal, a second image data set is acquired based on the $F_0$-signal and a third image data set is acquired based on the $F_{-1}$-signal. Advantageously, a spatial distribution of the $T_1$ and/or $T_2$ values is determined, which allows the generation of 2D or 3D maps of the determined $T_1$ and/or $T_2$ values. These $T_1$ and/or $T_2$ maps are advantageously generated automatically by a computer. The $T_1$ and/or $T_2$ maps are preferably represented as an overlay on a morphology image, wherein the morphology image is advantageously a weighted combination of the first, the second and the third image data set. The overlay may be displayed on a display. Preferably, the overlay is displayed on the display of a user interface used for controlling the MRI system, i.e. the user interface used by an operator for selecting the MRI sequences to be employed by the MRI system.

The sample is usually a living or dead human body, but of course also a living or dead animal body or any other kind of sample can be taken as the sample. Due to the usually present motion sensitivity of the unbalanced SSFP sequence, proper fixation of the sample is preferred during data acquisition. The method is preferably used for musculoskeletal and/or neuronal applications.

The flip angles of the RF pulses applied in the unbalanced SSFP sequence are preferably in the range of 10° to 30°, more preferably in the range of 10° to 25°, and most preferably about 15°. The signal-to-noise ratio for TESS relaxometry is maximized if these flip angles are applied for measuring typical $T_1$ and $T_2$ relaxation times present in human tissue. As usual with regard to unbalanced SSFP sequences, all RF pulses normally have the same or at least coherent phases.

Preferably, between each of two consecutive RF pulses of the unbalanced SSFP sequence a net gradient moment, i.e. a crusher gradient, is applied in the frequency encoding direction and/or in the slice selection direction, that results in a dephasing of the corresponding transverse magnetization of the sample over an angle of about $n \cdot 2\pi$, wherein n represents an arbitrary integer. In this context, the parameters of the unbalanced SSFP sequence are preferably chosen such that the integer n equals 1, in order to avoid motion or diffusion effects. Due to the application of this net gradient moment in the frequency encoding direction and/or in the slice selection direction within every TR, TESS is not affected by static field inhomogeneities.

Diffusion effects may reduce the MR signals acquired with unbalanced SSFP sequences such as TESS, especially at high-resolution. The sensitivity to diffusion increases with increasing dephasing moments which increase with decreasing voxel size (i.e. with higher resolution). For this reason, the net gradient moment for dephasing the transverse magnetization between two consecutive RF pulses is advantageously applied in the slice selection direction which is typically the lowest resolution axis. This allows to minimize the signal loss in unbalanced SSFP as reported in Bieri O, Ganter C, Scheffler K. On the fluid-tissue contrast behavior of high-resolution steady-state sequences. Magn Reson Med 2012; 68(5):1586-1592.

In order to achieve a constant dephasing within any TR, the phase-encoding gradient of the unbalanced SSFP sequence is usually rewound prior to each RF pulse, such that the net phase-encoding gradient moment applied within any TR equals zero. The moment(s) of the gradient(s) applied in frequency encoding (also called readout) direction are of course advantageously chosen in such a way, that the lowest order SSFP FID signal ($F_0$), the first order SSFP FID signal ($F_1$) and the lowest order SSFP Echo signal ($F_{-1}$) can be acquired within each TR, i.e. between each of two consecutive RF pulses.

For the determination of the $T_1$ and/or $T_2$ relaxation time at least the following ratios are calculated:

$$S_{T2}(T_1)=r_1/r_{01};\ S_{T1}(T_2)=r_{-1}/r_{02},$$

wherein $r_1$ defines a term including the magnitude (i.e. the intensity) of the $F_1$-signal, $r_{-1}$ defines a term including the magnitude of the $F_{-1}$-signal, and $r_{01}$ and $r_{02}$ each define a term including the magnitude of the $F_0$-signal.

With the knowledge of the imaging parameters (TR, $TE_{1,0,-1}$, and $\alpha$) and using the formulas above, the signal ratios $S_{T2}(T_1)$ and $S_{T1}(T_2)$ can be formulated as functions each depending on only $T_1$ and $T_2$. Hence, two independent equations with two unknowns ($T_1$ and $T_2$) are obtained. Since the two equations $S_{T2}(T_1)$ and $S_{T1}(T_2)$ for the determination of the $T_1$ and/or $T_2$ relaxation time usually cannot be solved analytically, a numerical approximation needs to be found. The algorithm for searching a numerical approximation can be simplified and accelerated, if, as a first criterion, the function $S_{T2}(T_1)$ is monotonic with regard to its variable $T_1$ for a given $T_2$, and the function $S_{T1}(T_2)$ is monotonic with regard to its variable $T_2$ for a given $T_1$. As a second criterion, the functions $S_{T2}(T_1)$ and $S_{T1}(T_2)$ should be as sensitive as possible with regard to $T_1$ and $T_2$, respectively. It has been found that this is the case, if $r_1$ is equal to the magnitude (i.e. intensity) of the $F_1$-signal, $r_{-1}$ is equal to the magnitude of the $F_{-1}$-signal, $r_{01}$ is equal to the magnitude of the $F_0$-signal, and $r_{02}$ is equal to the difference of the magnitudes of the $F_0$-signal and the $F_1$-signal. Alternatively, but less preferred, is a choice where $r_{02}$ is equal to the magnitude of the $F_0$-signal.

The searching of a numerical approximation for the $T_1$ and/or $T_2$ relaxation time is preferably carried out by the application of a one dimensional numerical minimization. A particular simple and fast minimization for this purpose is an iterative golden section search, with which typically less than 10 iterations are required for convergence of the algorithm.

The RF pulses are preferably spectrally selective, such that they affect nuclear spins of water molecules of the sample to a considerably larger extent than nuclear spins of fat molecules of the sample. To this end, binomial excitation pulses, such as $1\bar{2}1$-binomials, can for example be applied. The use of spectral-spatial excitation pulses not only enhances diagnostic information, but also eliminates the chemical shift artefact and thereby allows readout of the SSFP signal modes with a reduced receiver bandwidth which in turn results in an overall increased signal-to-noise ratio (SNR).

Additionally, a magnetic resonance imaging (MRI) system is provided for the determination of longitudinal ($T_1$) and/or transverse ($T_2$) relaxation times according to the method as described, the MRI system at least comprising a magnet for generating a main, particularly static magnetic field at a location of a sample to be imaged, in order to at least partly align nuclear spins of the sample;

an excitation module or device for applying a sequence of radio frequency (RF) pulses to the sample, in order to repeatedly excite the nuclear spins of the sample;

a gradient module or system for generating temporary magnetic gradient fields at a location of the sample;

an acquisition module or device, in particular an image acquisition module or device, for acquiring the magnetic resonance (MR) signals produced by excited nuclear spins of the sample;

a control module configured for controlling the excitation module, the gradient module and the acquisition module such, that the sample is subjected to an unbalanced steady state free precession (SSFP) sequence and a lowest order SSFP FID signal ($F_0$), a first order SSFP FID signal ($F_1$) and a lowest order SSFP Echo signal ($F_{-1}$) are acquired; and an analysis module being configured for determining the longitudinal ($T_1$) and/or transverse ($T_2$) relaxation time based on the $F_0$-signal, the $F_1$-signal and the $F_{-1}$-signal.

The control module or unit and the analysis module or unit can for example each be realized by hardware specifically dedicated for this purpose or by software being stored for example locally on a single device or distributed on multiple devices.

It is preferred, that the magnetic field $B_0$ generated by the main magnet is at least in the region of the sample essentially uniform. The magnitude of the magnetic field generated by the main magnet is preferably larger than 0.5 Tesla, more preferably larger than 1 Tesla, even more preferably larger than 2 Tesla and most preferably larger than 5 Tesla. With a stronger magnetic field, a better signal-to-noise ratio can be achieved, but imaging artefacts are also more pronounced.

The MRI system preferably also comprises an image reconstruction module for reconstructing a first image data set based on the acquired $F_1$-signal, a second image data set based on the acquired $F_0$-signal and a third image data set based on the acquired $F_{-1}$-signal.

Furthermore, a computer program, preferably stored on a storage device readable by a computer, is provided for controlling a magnetic resonance imaging (MRI) system as described and for determining the longitudinal ($T_1$) and/or transverse ($T_2$) relaxation time according to the method as described. The computer program comprises at least executable instructions to:

employ an unbalanced steady state free precession (SSFP) sequence on the MRI system;
acquire a first order SSFP FID signal ($F_1$);
acquire a lowest order SSFP FID signal ($F_0$);
acquire a lowest order SSFP Echo signal ($F_{-1}$); and
determine the longitudinal ($T_1$) and/or transverse ($T_2$) relaxation times of the sample based on the $F_0$-signal, the $F_1$-signal and the $F_{-1}$-signal.

Thus, the computer program carries out central parts of the method described above when executed in a processor of a MRI system or in a processer being connected with a MRI system. The computer program is usually realized as a computer program code element which comprises computer-implemented instructions to cause a processor to carry out a particular method. It can be provided in any suitable form, including source code or object code. In particular, it can be stored on a computer-readable medium or embodied in a data stream. The data stream may be accessible through a network such as the Internet.

SHORT DESCRIPTION OF THE FIGURES

Preferred embodiments of the invention are described in the following with reference to the drawings, which only serve for illustration purposes, but have no limiting effects. In the drawings it is shown:

DESCRIPTION OF PREFERRED EMBODIMENTS

Figure 1:
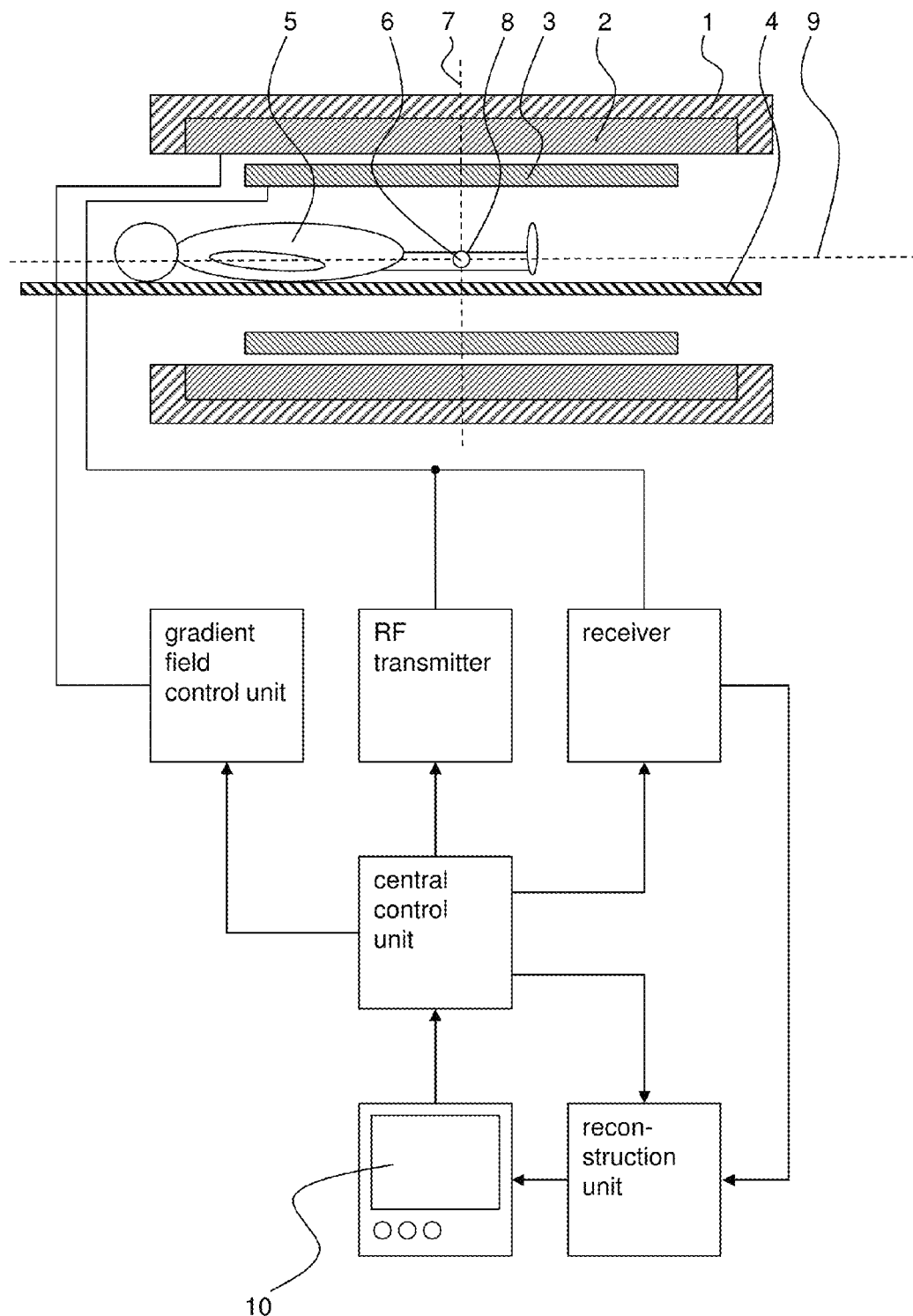
FIG. 1 shows a schematic illustration of a MRI system for carrying out the inventive method according to a first embodiment.
Figure 2:
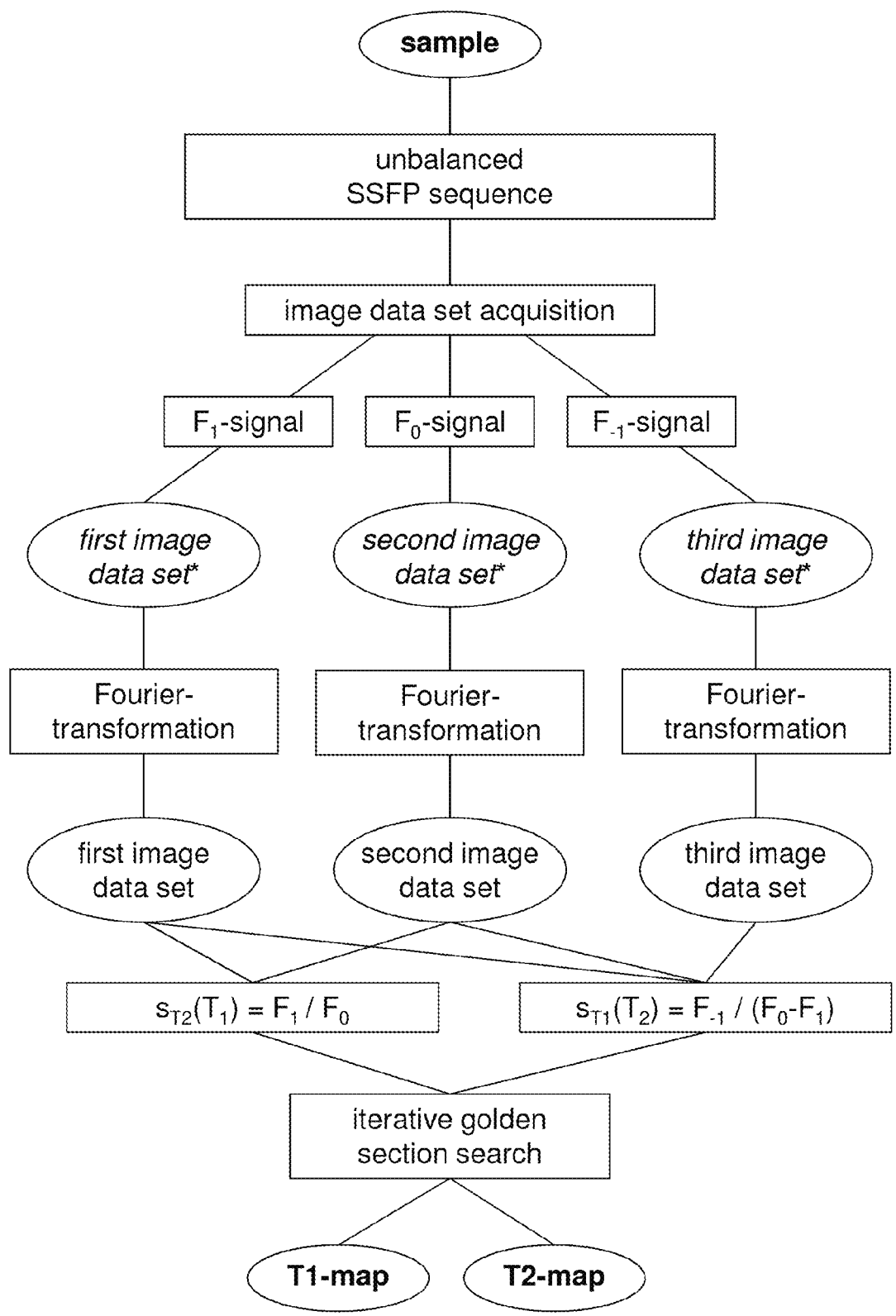
FIG. 2 shows a flow chart illustrating an example for carrying out the inventive method.

In FIG. 1, an exemplary MRI system is shown which serves to carry out the inventive method for the quantification of the longitudinal ($T_1$) and transverse ($T_2$) relaxation times in a sample. A flow chart illustrating an example of an inventive method is shown in FIG. 2.

The MRI system comprises a main magnet 1 for producing a main magnetic field $B_0$. The main magnet 1 usually has the essential shape of a hollow cylinder with a horizontal bore. Inside the bore of the main magnet 1 a magnetic field is present, which is essentially uniform at least in the region of the isocenter 6 of the main magnet 1. The main magnet 1 serves to at least partly align the nuclear spins of a sample 5 arranged in the bore. Of course, the magnet 1 does not necessarily be cylinder-shaped, but could for example also be C-shaped.

The sample 5 is arranged in such a way on a moving table 4 in the bore of the main magnet 1, that the part of the sample 5, of which the longitudinal ($T_1$) and/or transverse ($T_2$) relaxation times are to be determined, is arranged in the region of the isocenter 6 of the magnet 1. In the present example according to FIG. 1, a human knee is assessed, which, in order to avoid motion artefacts, is immobilized during data acquisition by means of a corresponding fixation (not shown).

The main magnet 1 has a z-axis 9 which coincides with the central longitudinal axis defined by the cylindrical shape of the magnet 1. Together with a x-axis 7 and a y-axis 8, which each extend in mutually perpendicular directions with respect to the z-axis 9, the z-axis 9 defines a Cartesian coordinate system of the MRI system, having its origin at the isocenter of the magnet 1.

In order to produce a magnetic field which linearly varies in the direction of the x-axis 7, the y-axis 8 and/or the z-axis 9, the MRI-system comprises a gradient system 2 including several coils for producing these varying magnetic fields. A radiofrequency (RF) coil 3 is provided for generating a transmit field $B_1$, in order to repetitively excite the nuclear spins of the sample 5.

As illustrated in FIG. 2, the sample 5 is subjected to an unbalanced steady state free precession (SSFP) sequence. The unbalanced SSFP sequence is initiated by an operator by means of a user interface 10, which sends the respective instructions to a central control unit of the MRI system (FIG. 1). The central control unit controls a gradient field control unit being connected with the gradient system 2 as well as a RF transmitter and a receiver both being connected with the RF coil 3. The gradient system 2 and the gradient field control unit together constitute a gradient module of the MRI system. The central control unit controls the gradient field control unit, the RF transmitter and the receiver such, that an imaging sequence is employed on the MRI system, which allows the acquisition of a first image data set based on the first order SSFP FID signal ($F_1$), a second image data set based on the lowest order SSFP FID signal ($F_0$) and a third image data set based on the lowest order SSFP Echo signal ($F_{-1}$).

The receiver, which constitutes an acquisition module together with the RF coil 3, is connected with a reconstruction unit, in which the acquired $F_1$-, $F_0$- and $F_{-1}$-signals are reconstructed to form the corresponding first, second and third image data sets, each being composed of a plurality of the corresponding $F_1$-, $F_0$- or $F_{-1}$-signals. After completed image acquisition, these image data sets, which are still spatial spectral image data sets in k-space and are therefore marked with the suffices * in FIG. 2, are transferred to image space by means of an (inverse) Fourier transformation carried out by the reconstruction unit. In order to account for the specific imaging parameters applied during image acquisition, the reconstruction unit is connected with the central control unit. The reconstructed first, second and third image data sets are then sent to the user interface 10.

In the user interface 10, which also represents an analysis module and is usually realized by a customary personal computer, the following ratios are calculated based on the first, the second and the third image data set:

$$s_{T_2}(T_1) := \frac{F_1}{F_0}, \quad s_{T_1}(T_2) := \frac{F_{-1}}{F_0 - F_1}$$

In order to calculate these ratios, the corresponding signal intensities of a certain voxel of the first, the second and the third image data set are inserted in the calculations above. Thus, the signal intensity of a voxel of the first image data set ($F_1$) is divided by the signal intensity of the same voxel of the second image data set ($F_0$), in order to calculate $S_{T_2}$. For the calculation of $S_{T_1}$, the signal intensity of a voxel of the first image data set ($F_1$) is subtracted from the signal intensity of the corresponding voxel of the second image data set ($F_0$). The signal intensity of the same voxel of the third image data set ($F_{-1}$) is then divided by the result of this subtraction, in order to yield $S_{T_1}$. Instead of the signal intensity of a certain voxel to be examined of course it would also be possible to insert for example the averaged signal intensity of a certain region-of-interest (ROI) into the equations above, in order to calculate $S_{T_2}$ and $S_{T_1}$.

The ratios $S_{T_2}$ and $S_{T_1}$ can be calculated for a single voxel only or, preferably, individually and independently for a large number of voxels covering a certain region-of-interest (ROI) or even for each voxel of the acquired images, in order to yield a $T_1$-and/or $T_2$-map of the corresponding region.

The subscript $T_2$ ($T_1$) in the expression $S_{T_2}$ ($S_{T_1}$) is used to indicate that for the ratio $S_{T_2}(T_1)$ ($S_{T_1}(T_2)$) the relaxation time $T_2$ ($T_1$) is considered to be a bound variable: formally, the signal ratios then depend for any given set of extrinsic parameters (TR, $TE_{1,0,-1}$, and α) only on one running variable, namely $T_1$ or $T_2$.

Figure 3:
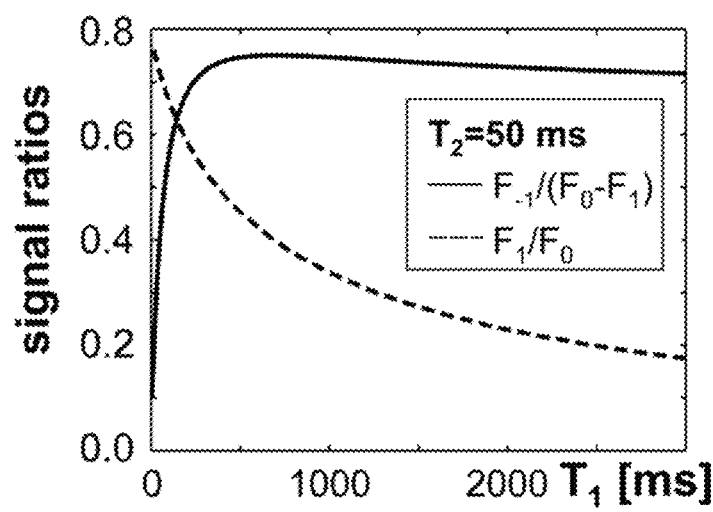
FIG. 3 shows a simulation of the signal ratios $S_{T1}$ ($T_2$) and $S_{T2}$($T_1$) as a function of $T_1$ for a fixed $T_2$ of 50 ms.
Figure 4:
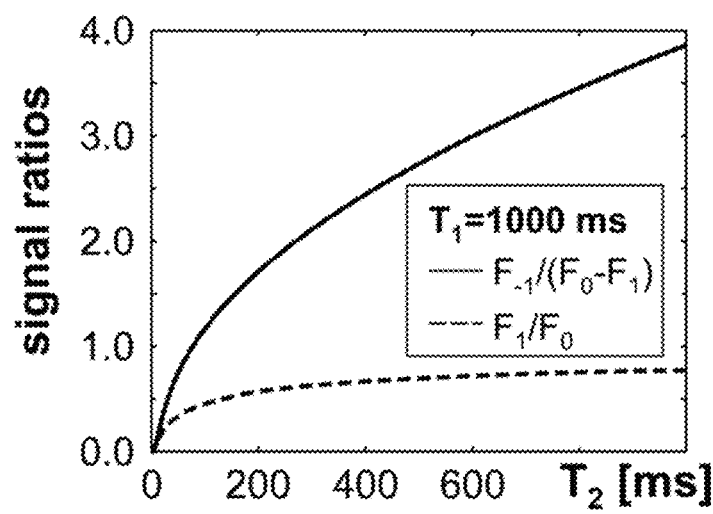
FIG. 4 shows a simulation of the signal ratios $S_{T1}$ ($T_2$) and $S_{T2}$($T_1$) as a function of $T_2$ for a fixed $T_1$ of 1000 ms.

The specific choice of the signal ratios $S_{T_2}$ and $S_{T_1}$ as given above is motivated as follows: Instead of the basic ratio $F_{-1}/F_0$ which is used with double echo SSFP (DESS) for $T_2$ quantification, the ratio $F_{-1}/(F_0-F_1)$ is investigated, since it shows a stronger sensitivity to $T_2$ (see FIG. 4 where the good $T_2$-sensitivity of this ratio is apparent in a simulation for a fixed $T_1$ of 1000 ms using a flip angle of 15°). For $T_1$ estimation using TESS, another independent ratio is required and $F_1/F_0$ is chosen, because of its strong sensitivity to $T_1$ (see FIG. 3 in which the simulated signal ratio is shown for a fixed $T_2$ of 50 ms using a flip angle of 15°). It was looked for signal ratios which are bijective functions of either $T_1$ or $T_2$. More precisely, it was looked for a ratio $S_{T_2}(T_1)$ ($S_{T_1}(T_2)$) which is bijective with respect to $T_1$ ($T_2$) which holds for this choice. Otherwise the subsequent minimization might run into local rather than global minima.

For the derivation of $T_1$ and $T_2$ from $S_{T_2}(T_1)$ and $S_{T_1}(T_2)$, an easy and fast iterative procedure based on a one dimensional numerical minimization can be used, as described in the following: A search interval for $T_1$ and $T_2$ with a (dummy) upper guess of $T_{1,u}=T_{2,u}=5$ s is defined. The iteration is initialized with a global estimate for the longitudinal relaxation time, $T_{1,i=0} \in [0, T_{1,u}]$, and a golden section search is performed to calculate an estimate for the transverse relaxation time, $T_{2,i+1}$, based on the measured signal ratio $S_{T_1}$, $$T_{2,i+1} = \arg\min\{T_2 \in [0, T_{2,u}]: |s_{T_1,meas} - s_{T_1,i}(T_2)|\}$$

Now, the obtained guess of $T_{2,i+1}$ is used to yield an improved $T_{1,i+1}$ estimate based on the signal ratio $S_{T_2}$, according to $$T_{1,i+1} = \arg\min\{T_1 \in [0, T_{1,u}]: |s_{T_2,meas} - s_{T_2,i+1}(T_1)|\}$$

again using a golden section search, but now on $T_1$. The improved $T_{1,i+1}$ estimate can then be used again to calculate an updated $T_{2,i+2}$ estimate based on the equation for $S_{T_1}$, and so on. The iteration stops as soon as the change in both $T_1$ and $T_2$ is less than a user defined convergence tolerance, i.e. 0.1 ms. While iterating, the whole search procedure becomes independent of the initial $T_1$ estimate. Here, a consistent rough global estimate of $T_1=1000$ ms is used. Even with such a rough guess, typically less than 10 iterations are required for convergence of the algorithm.

Figure 5:
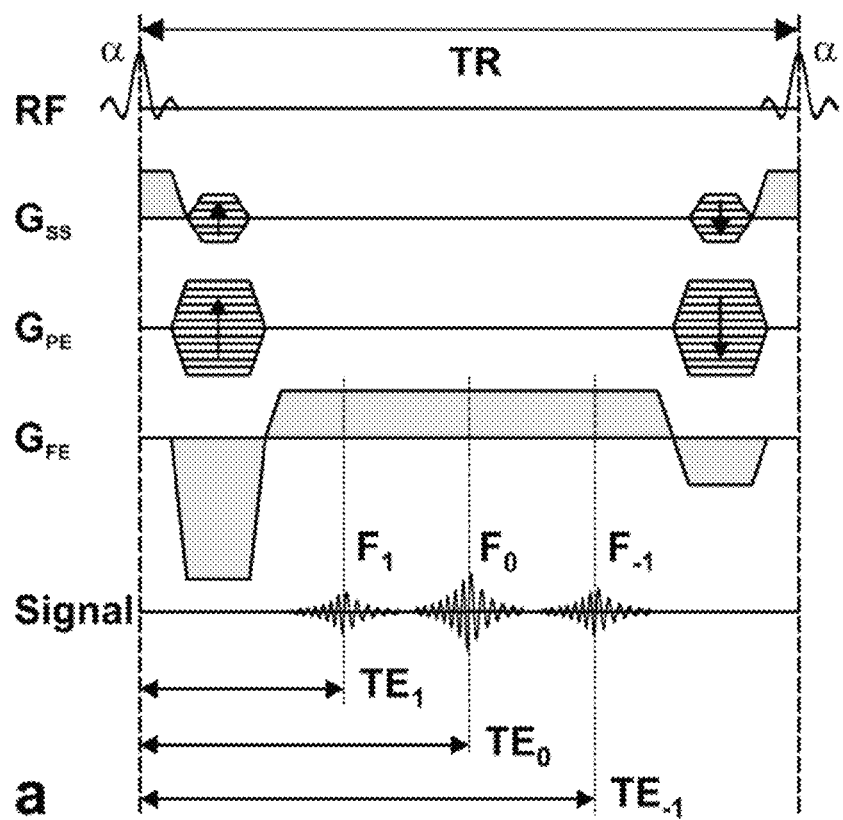
FIG. 5 shows a first example of a MRI sequence for the determination of the longitudinal ($T_1$) and/or transverse ($T_2$) relaxation times of a sample, with gradient spoiling in frequency encoding (FE) direction and with three-dimensional data acquisition.

A three-dimensional TESS sequence is conceptually shown in FIG. 5. For a person skilled in the art it is evident that in FIG. 5 (as well as in FIGS. 6-8) only a part of the sequence which is actually carried out on the MRI-system is shown. The part of the sequence shown in FIG. 5 (and in FIGS. 6-8) is repeated numerous times, usually with slightly changed phase encoding and/or slice selection gradients (see the arrows in the respective gradients shown in FIGS. 5-8), until the data set for reconstructing the first, the second and the third image data set is complete. Usually, the main sequence part consisting of a certain number of repetitions of the part shown in FIG. 5 (or in FIGS. 6-8) is preceded by a preparation sequence, for example a dummy sequence without signal acquisition, in order to reach the steady state.

In the TESS sequence shown in FIG. 5, the center FID ($F_0$) is flanked by a higher order FID to the left ($F_1$) and by the lowest order Echo ($F_{-1}$) to the right, with echo times $TE_0$, $TE_1$, and $TE_{-1}$, respectively. The crusher gradients are played out in frequency encoding (FE) direction, in which first a negative gradient moment is applied, in order to prephase the transverse magnetization by an angle of $3\pi$, and then a positive gradient moment is applied, in order to re-/dephase the transverse magnetization by a total angle of $6\pi$ for yielding the signals $F_1$, $F_0$ and $F_{-1}$. Prior to the subsequent RF pulse, the transverse magnetization is again rewound by an angle of $\pi$, such that a net gradient in FE direction between two consecutive RF pulses of $2\pi$ results. The phase encoding gradient is rewound prior to each RF pulse, such that the total net gradient in phase encoding (PE) direction between two consecutive RF-pulses is zero.

Figure 6:
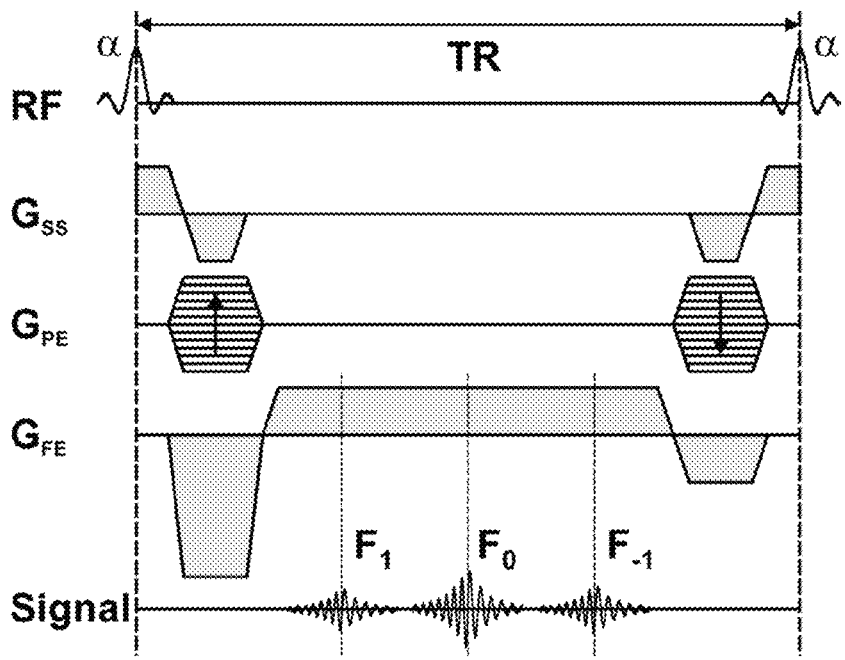
FIG. 6 shows a second example of a MRI sequence for the determination of the longitudinal ($T_1$) and/or transverse ($T_2$) relaxation times of a sample, with gradient spoiling in frequency encoding (FE) direction and with two-dimensional data acquisition.

In FIG. 6 another possible implementation of a TESS sequence is shown, which differs from the one shown in FIG. 5 by the acquisition of two-dimensional data, i.e. multi-slice acquisitions, instead of volumetric, three-dimensional data.

Figure 7:
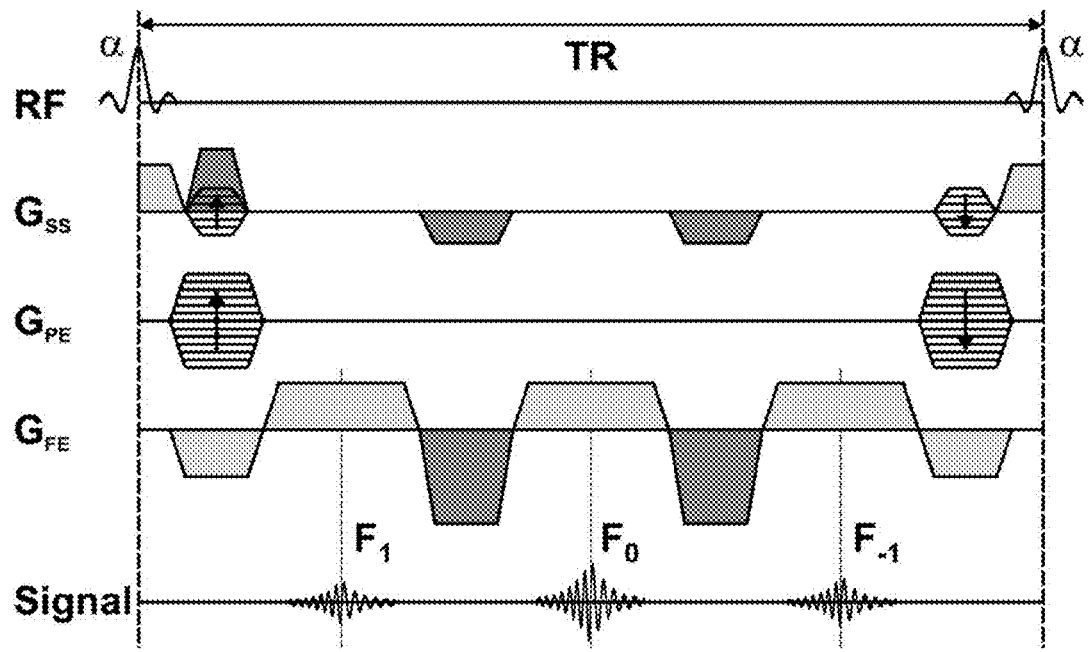
FIG. 7 shows a third example of a MRI sequence for the determination of the longitudinal ($T_1$) and/or transverse ($T_2$) relaxation times of a sample, with gradient spoiling in slice selection (SS) direction and with three-dimensional data acquisition.
Figure 8:
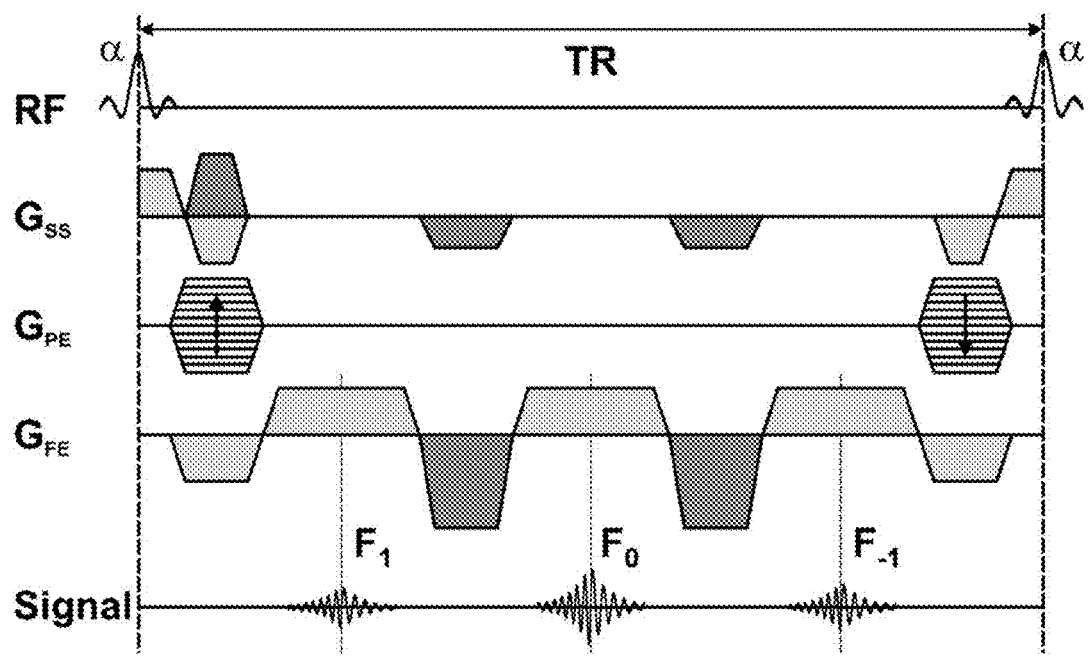
FIG. 8 shows a fourth example of a MRI sequence for the determination of the longitudinal ($T_1$) and/or transverse ($T_2$) relaxation times of a sample, with gradient spoiling in slice selection (SS) direction and with two-dimensional data acquisition.

In the more preferred TESS sequences shown in FIGS. 7 and 8, crusher gradients are not performed in frequency encoding (FE) direction, but in slice selection (SS) direction. FIG. 7 shows a three-dimensional data acquisition, and FIG. 8 shows a two-dimensional data acquisition.

Figure 9:
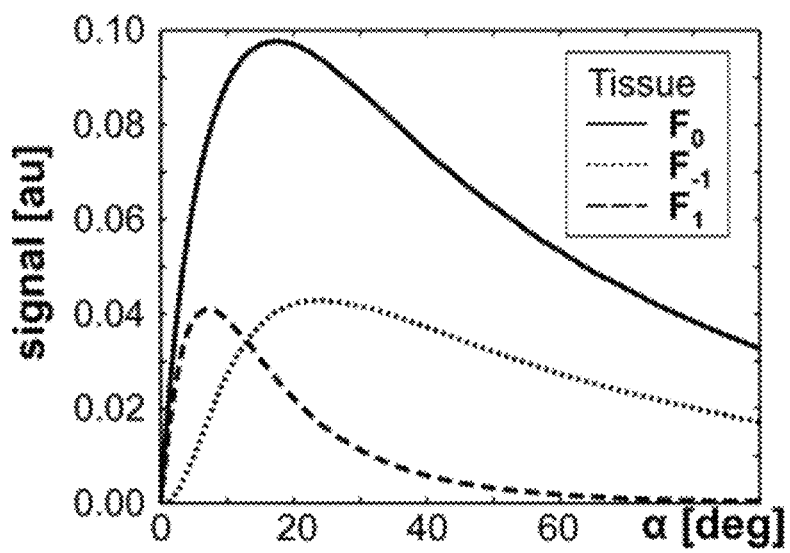
FIG. 9 shows a simulation of the TESS signals for tissues as a function of the flip angle α.
Figure 10:
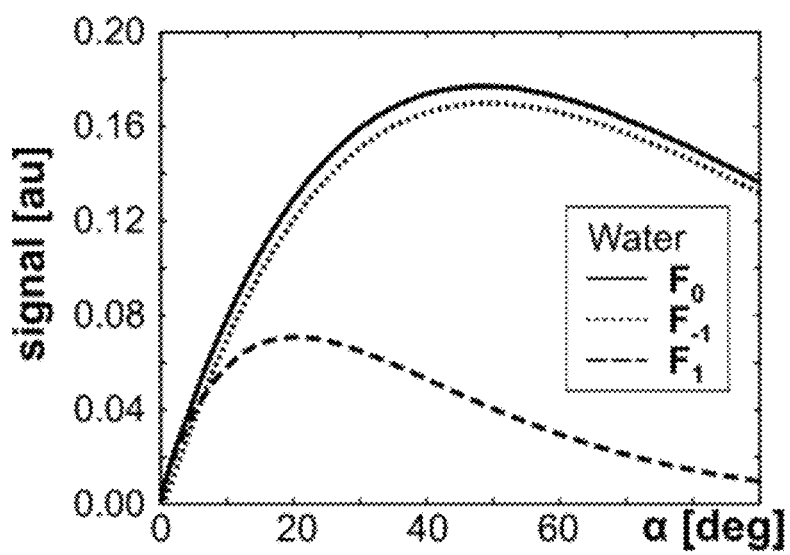
FIG. 10 shows a simulation of the TESS signals for water as a function of the flip angle α.

Exemplary simulated $F_1$, $F_0$, and $F_{-1}$ steady state signal levels for tissues and fluids are shown in FIGS. 9 and 10 as a function of the flip angle. The simulation parameters for obtaining these signal levels are as follows: TR=16 ms, $TE_1=TE_0 \to 0$, and $TE_{-1} \to TR$, tissues: $T_1/T_2$=1000 ms/50 ms, water: $T_1/T_2$=3000 ms/1000 ms.

Figure 11:
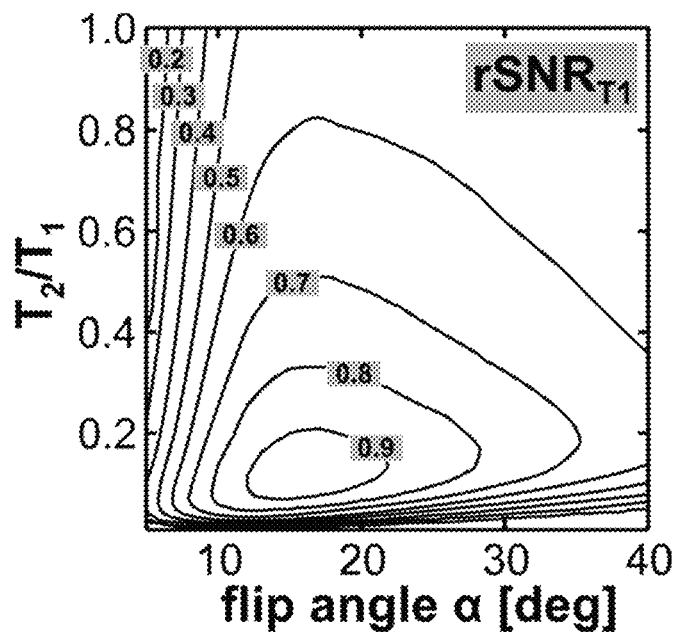
FIG. 11 shows a simulation of the relative signal-to-noise ratio (rSNR, isolines shown) for $T_1$ mapping using TESS relaxometry.
Figure 12:
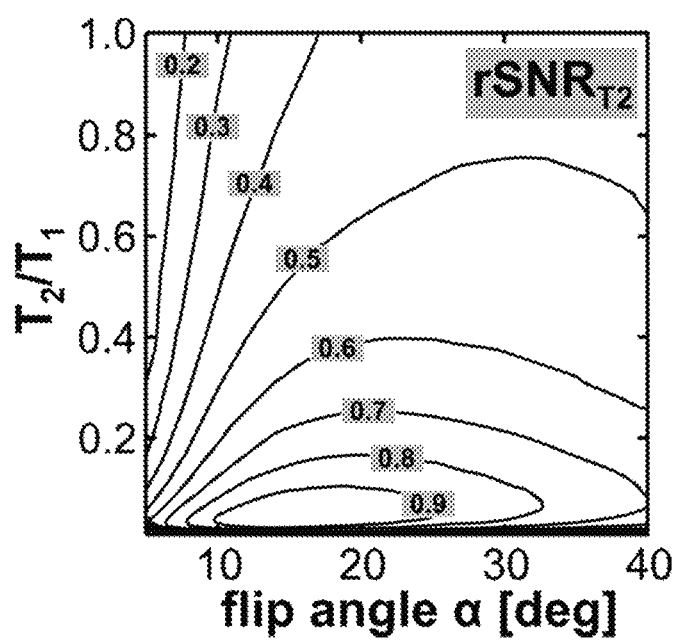
FIG. 12 shows a simulation of the relative signal-to-noise ratio (rSNR, isolines shown) for $T_2$ mapping using TESS relaxometry.

For high-resolution in vivo TESS relaxometry, the signal-to-noise ratio (SNR) is expected to become critical and propagation of noise must be evaluated. Corresponding results of a Monte-Carlo simulation are shown in FIGS. 11 and 12 for a TR of 16 ms. The expected relative SNR (rSNR) for $T_1$ (FIG. 11) and $T_2$ (FIG. 12) mapping using TESS is strongly affected by the choice of the flip angle (as might already be expected from the corresponding signal curves, see FIGS. 9 and 10). Generally, a pronounced rSNR maximum can be observed in both $T_1$ and $T_2$ near $\alpha \sim 15°$ with respect to a $T_2/T_1 \sim 0.05-0.1$, that is for tissues. As a result, optimal SNR for TESS-based relaxometry can be achieved in the low flip angle and low $T_2/T_1$ limit. Moreover, the use of low flip angles of the RF pulses is beneficial, in order to limit the resulting specific absorption rate (SAR) of energy being deposed in the tissue during the MRI scan, in particular at high and ultra-high field strengths.

In a concrete measurement, in vivo TESS scans of a human knee joint were performed on a 3 T system (Magnetom Verio, Siemens Medical Solution, Erlangen, Germany) with 3D TESS in axial and sagittal orientation (the slab consisted of 12 slices with 3 mm resolution) using a dedicated 15-channel transmit and receive knee coil (QED) yielding 0.6×0.6 mm² in-plane resolution (256×232×18 image encoding matrix). Imaging was performed with water-selective excitation pulses ($1\bar{2}1$-binomials) of nominal 15° flip angle. The bandwidth (the same for all three echoes) was set to 230 Hz/pixel, yielding a TR of 20.6 ms and corresponding echo times $TE_1$=6.6 ms, $TE_0$=11.0 ms, and $TE_{-1}$=15.4 ms. Seven averages were taken. The 3D TESS scan was completed within 4 min and 24 s.

Figure 13:
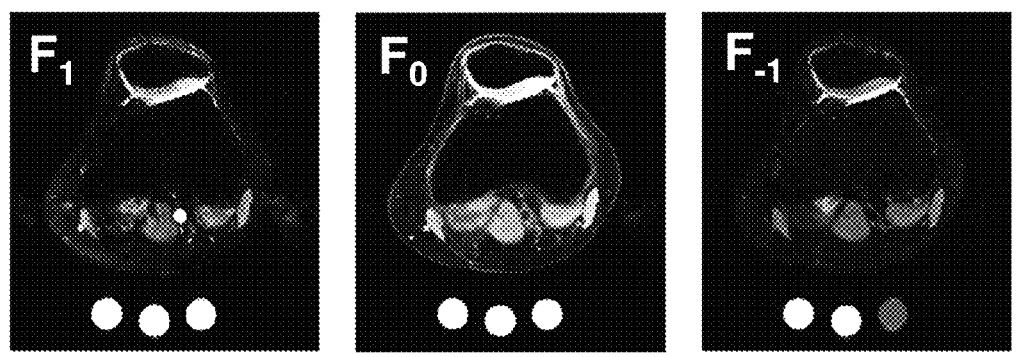
FIG. 13 shows exemplary TESS base images ($F_1$, $F_0$, and $F_{-1}$) of an axial slice of the knee joint at 3 T.
Figure 14:
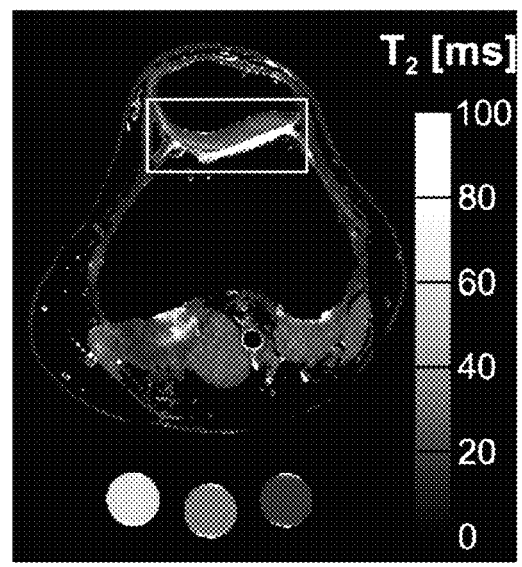
FIG. 14 shows $T_2$ values derived by TESS based on the images shown in FIG. 13.
Figure 15:
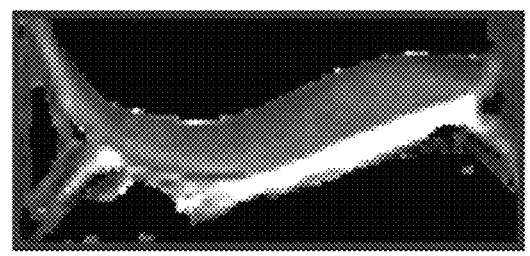
FIG. 15 shows an enlarged detail view of the rectangular region indicated in FIG. 14.

High-resolution in vivo 3D TESS relaxometry is demonstrated in the knee joint at 3 T in axial (FIGS. 13-15) and sagittal (FIGS. 16-18) slice orientation using optimal flip angles for tissues. For presentation purposes the brightness of the TESS base images ($F_1$, $F_0$ and $F_{-1}$) shown in FIG. 13 has been adjusted independently for each image. As an internal control, three small test tubes containing 0.125 mM, 0.25 mM, and 0.5 mM $MnCl_2$ were placed adjacent to the knee for the axial scan. $B_1$-insensitive TESS-$T_2$ quantification is illustrated in FIGS. 14 and 15.

Figure 16:
FIG. 16 shows a morphological TESS image, calculated from a weighted combination of the $F_0$ and $F_{-1}$ signal (sagittal slice through a human knee joint)

The morphological image shown in FIG. 16 was calculated from a weighted combination of the $F_0$- and $F_{-1}$-signal ($F_0+3F_{-1}$) to accentuate the contrast between synovial fluid and cartilage.

Figure 17:
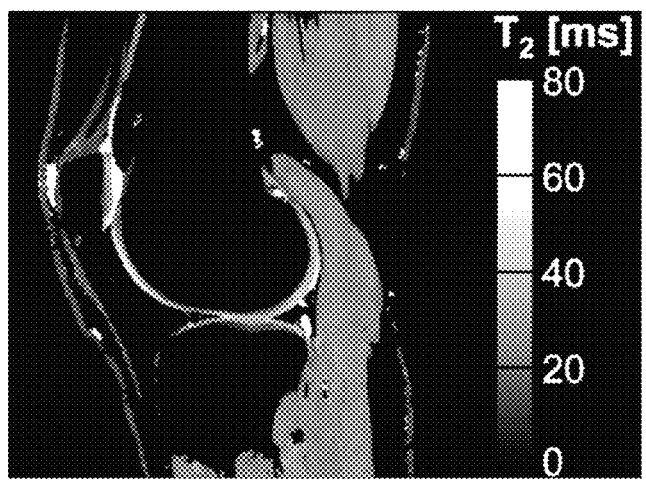
FIG. 17 shows the $T_2$-map calculated from the same TESS images as used for the calculation of the image shown in FIG. 16.
Figure 18:
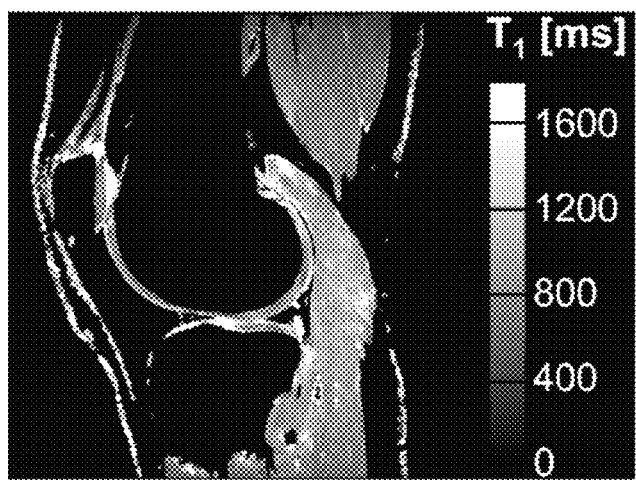
FIG. 18 shows the $T_1$-map calculated from the same TESS images as used for the calculation of the image shown in FIG. 16.

The distinct $B_1$-insensitivity of TESS-$T_2$ becomes especially apparent in the sagittal $T_2$ scan where no variation in muscle-$T_2$ can be observed over the complete field-of-view (FOV) (FIG. 17). This is quite contrary to the corresponding TESS-$T_1$ map (FIG. 18): It appears more inhomogeneous and shows clearly visible variations in muscle-$T_1$ over the FOV originating from $B_1$ heterogeneities, i.e. originating from a miscalibration between the nominal and the actual flip angle $\alpha$ of the RF pulses. Therefore, in order to obtain accurate $T_1$-maps over the entire FOV, corrective data should be acquired prior to the TESS-scan, the acquisition of which is well known to the person skilled in the art.

The invention is of course not limited to the preceding presented embodiments and examples and a plurality of modifications is possible. For example, crusher gradients can be applied in the phase encoding (PE) direction, or even in multiple directions (FE and SS, FE and PE, SS and PE, FE and PE and SS), and it is not absolutely necessary to acquire the $F_0$-signal, the $F_1$-signal and the $F_{-1}$-signal within the same repetition interval TR between two consecutive RF pulses. These three signals and/or corresponding image data sets could for example also be acquired by means of three individually configured sequences, which are each adapted for the acquisition of one of the signals $F_0$, $F_1$ and $F_{-1}$ and are applied sequentially after each other. Instead of an iterative golden section search a large variety of other numerical approximations is known to the person skilled in the art and is applicable for the determination of the $T_1$ and the $T_2$ values. A plurality of further modifications is possible.

| REFERENCE NUMERALS | |
| --- | --- |
| 1 | Main magnet |
| 2 | Gradient system |
| 3 | RF coil |
| 4 | Moving table |
| 5 | Patient |
| 6 | Isocenter |
| 7 | X-axis |
| 8 | Y-axis |
| 9 | Z-axis |
| 10 | User interface |

The invention claimed is:

1. A magnetic resonance imaging (MRI) method for the quantification of a longitudinal relaxation time $T_1$ and/or a transverse relaxation time $T_2$ in a sample, comprising at least the following steps:
   subjecting a sample to an unbalanced steady state free precession (SSFP) sequence comprising a series of consecutive radiofrequency (RF) pulses;
   acquiring a first order SSFP FID signal $F_1$;
   acquiring a lowest order SSFP FID signal $F_0$;
   acquiring a lowest order SSFP Echo signal $F_{-1}$; and
   determining a longitudinal relaxation time $T_1$ and/or a transverse relaxation time $T_2$ of the sample based on the $F_0$-signal, the $F_1$-signal and the $F_{-1}$-signal.

2. The MRI method as claimed in claim 1, wherein for the determination of the $T_1$ and/or $T_2$ relaxation time at least the following ratios are calculated:

$$S_{T2}(T_1)=r_1/r_{01}; S_{T1}(T_2)=r_{-1}/r_{02},$$

and wherein $r_i$ defines a term including the magnitude of the $F_1$-signal, $r_{-1}$ defines a term including the magnitude of the $F_{-1}$-signal, and $r_{01}$ and $r_{02}$ each define a term including the magnitude of the $F_0$-signal.

3. The MRI method as claimed in claim 2, wherein $r_1$ is equal to the magnitude of the $F_1$-signal, $r_{-1}$ is equal to the magnitude of the $F_{-1}$-signal, $r_{01}$ is equal to the magnitude of the $F_0$-signal, and $r_{02}$ is equal to the difference of the magnitudes of the $F_0$-signal and the $F_1$-signal.

4. The MRI method as claimed in claim 1, wherein an iterative golden section search is performed, in order to determine the $T_1$ and/or $T_2$ relaxation time.

5. The MRI method as claimed in claim 1, wherein the repetition time interval TR between each of two consecutive RF pulses is shorter than the transverse relaxation time $T_2$ of the sample, preferably shorter than 50 ms, more preferably shorter than 30 ms and most preferably shorter than 20 ms.

6. The MRI method as claimed in claim 1, wherein the echo time $TE_0$ of the lowest order SSFP FID signal $F_0$ is less than 15 ms.

7. The MRI method as claimed in claim 1, wherein the flip angles of the RF pulses are in the range of 10° to 30°.

8. The MRI method as claimed in claim 1, wherein between each of two consecutive RF pulses a net gradient moment is applied in the frequency encoding direction and/or in the slice selection direction, that results in a dephasing of the transverse magnetization of the sample over an angle of about n·2π and wherein n represents an arbitrary integer.

9. The MRI method as claimed in claim 8, wherein the net gradient moment is applied in the slice selection direction.

10. The MRI method as claimed in claim 1, wherein a first image data set is acquired based on the first order SSFP FID signal $F_1$, a second image data set is acquired based on the lowest order SSFP FID signal $F_0$ and a third image data set is acquired based on the lowest order SSFP Echo signal $F_{-1}$.

11. The MRI method as claimed in claim 1, wherein a spatial distribution of the $T_1$ and/or $T_2$ relaxation times in the sample is determined.

12. The MRI method as claimed in claim 1, wherein the lowest order SSFP FID signal $F_0$, the first order SSFP FID signal $F_1$ and the lowest order SSFP Echo signal $F_{-1}$ are acquired between each of two consecutive RF pulses.

13. The MRI method as claimed in claim 1, wherein the RF pulses are spectrally selective, such that they affect nuclear spins of water molecules of the sample to a considerably larger extent than nuclear spins of fat molecules of the sample.

14. A non-transitory computer-readable medium comprising a computer program for controlling a magnetic resonance imaging (MRI) system and for determining a longitudinal relaxation time $T_1$ and/or a transverse relaxation time $T_2$ based on image data sets acquired by the MRI system, the computer program at least comprising executable instructions to:
   employ an unbalanced steady state free precession (SSFP) sequence on the MRI system;
   acquire a first order SSFP FID signal $F_1$;
   acquire a lowest order SSFP FID signal $F_0$;
   acquire a lowest order SSFP Echo signal $F_{-1}$; and
   determine a longitudinal relaxation time $T_1$ and/or a transverse relaxation time $T_2$ of the sample based on the $F_0$-signal, the $F_1$-signal and the $F_{-1}$-signal.

15. A magnetic resonance imaging (MRI) system at least comprising
   a magnet for generating a main magnetic field at a location of a sample to be imaged, in order to at least partly align nuclear spins of the sample;
   an excitation module for applying a sequence of radio frequency (RF) pulses to the sample, in order to repeatedly excite the nuclear spins of the sample;
   a gradient module for generating temporary magnetic gradient fields at a location of the sample;
   an acquisition module for acquiring the magnetic resonance (MR) signals produced by excited nuclear spins of the sample;
   a control module configured for controlling the excitation module, the gradient module and the acquisition module such, that the sample is subjected to an unbalanced steady state free precession (SSFP) sequence and a lowest order SSFP FID signal $F_0$, a first order SSFP FID signal $F_1$ and a lowest order SSFP Echo signal $F_{-1}$ are acquired; and
   an analysis module being configured for determining a longitudinal relaxation time $T_1$ and/or a transverse relaxation time $T_2$ based on the $F_0$-signal, the $F_1$-signal and the $F_{-1}$-signal.

16. The MRI method as claimed in claim 1, wherein the echo time $TE_0$ of the lowest order SSFP FID signal $F_0$ is less than 10 ms.

17. The MRI method as claimed in claim 7, wherein the flip angles of the RF pulses are in the range 10° to 25°.

18. The MRI method as claimed in claim 7, wherein the flip angles of the RF pulses are about 15°.

19. The MRI method as claimed in claim 1, wherein between each of two consecutive RF pulses a net gradient moment is applied in the frequency encoding direction and/or in the slice selection direction, that results in a dephasing of the transverse magnetization of the sample over an angle of about 2π.

* * * * *